United States Patent [19]

Dijkmans

[11] Patent Number: 4,636,739
[45] Date of Patent: Jan. 13, 1987

[54] CIRCUIT FOR REDUCING THE OCCURRENCE OF SPURIOUS SIGNALS ON AN OUTPUT OF AN ELECTRONIC CIRCUIT WHEN THE CIRCUIT POWER SUPPLY IS SWITCHED ON AND OFF

[75] Inventor: Eise C. Dijkmans, Eindhoven, Netherlands

[73] Assignee: U.S. Philips Corporation, New York, N.Y.

[21] Appl. No.: 799,876

[22] Filed: Nov. 20, 1985

[30] Foreign Application Priority Data

Dec. 17, 1984 [NL] Netherlands ............................ 8403820

[51] Int. Cl.$^4$ .............................................. H03F 1/00
[52] U.S. Cl. ...................................... 330/51; 330/288; 330/149; 381/94
[58] Field of Search ......................... 330/51, 149, 288; 381/94; 455/174, 194, 222, 223, 224

[56] References Cited

U.S. PATENT DOCUMENTS 4,315,221  2/1982  Numata et al. ......................... 330/51
4,371,841  2/1983  Eckert et al. .......................... 330/51

*Primary Examiner*—James B. Mullins
*Attorney, Agent, or Firm*—Thomas A. Briody; William J. Streeter; Marianne R. Rich

[57] ABSTRACT

In order to avoid the occurrence of spurious signals on the output (3) of an electrical circuit (1) when the circuit power supply is switched on and off, the output (3) is disconnected from the remainder of the circuit under the control of a control device (5). The control device comprises a current mirror whose input path ($T_1$, $R_1$) is in series with a first resistor ($R_3$) and whose output path ($T_2$, $R_2$) is in series with a capacitor ($C_1$) between the first (10) and the second (20) power supply terminal. The input and the output path are connected to the bases (12, 14) of two transistors ($T_3$, $T_4$) which are connected as a differential pair and whose common emitters are coupled to the positive power supply terminal (10) by means of a second resistor ($R_4$). After switching on of the power supply the capacitor ($C_1$) is charged via the current mirror ($T_1$, $R_1$; $T_2$, $R_2$), so that the differential-pair transistor ($T_4$) which is coupled to the transistor ($C_1$) gradually turns off in favor of the other transistor ($T_3$) of the pair. As a result of this, the output (3) is connected to the electronic circuit (1) some time after switching on of the power supply. When the power supply is switched off the differential-pair transistors ($T_3$, $T_4$) are cut off immediately, so that the output (3) is disconnected immediately from the electronic circuit (1).

4 Claims, 1 Drawing Figure

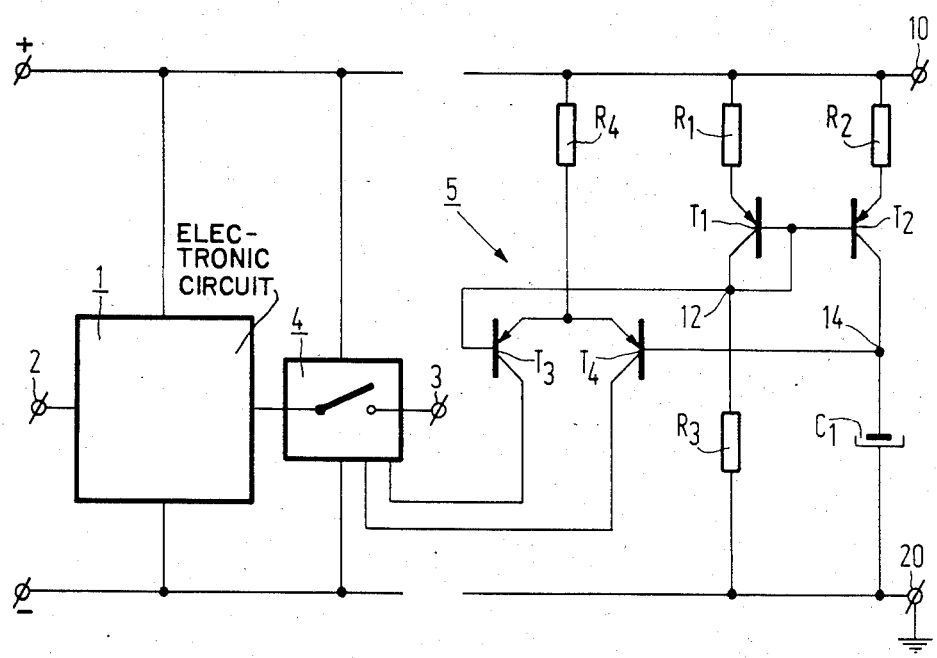

CIRCUIT FOR REDUCING THE OCCURRENCE OF SPURIOUS SIGNALS ON AN OUTPUT OF AN ELECTRONIC CIRCUIT WHEN THE CIRCUIT POWER SUPPLY IS SWITCHED ON AND OFF

The invention relates to a circuit for reducing the occurrence of spurious signals on an output of an electronic circuit when the circuit power supply is switched on and off. A switching device is provided for suppressing the supply of signals to the output of the circuit when the power supply is switched on and off. The switching device is controlled by a control circuit comprising a capacitor connected between a first and a second power-supply terminal, which capacitor is charged when the power supply is switched on and discharged when the power supply is switched off.

When the power supply to a circuit is switched on and off this is liable to give rise to irregular voltage transients on the output of the circuit as a result of varying direct-voltage and direct-current settings. Such voltage transients appear inter alia on the output of a Compact Disc player, which output is constituted by the output of an active low-pass filter. If the player is connected to an amplifier and loudspeaker system, these voltage transients produce popping sounds, which may even damage the loudspeaker. In order to reduce the occurrence of these voltage transients use is made of switching devices (muting circuits) which disconnect the output from the remainder of the circuit when the power supply is switched on and off. The switching device is controlled by a control device in such a way that the output is not connected to the remainder of the circuit until some time after the power supply has been switched on and is disconnected immediately after switching off.

A circuit of the type specified in the opening paragraph is described in U.S. Pat. No. 4,371,841. In this circuit the control circuit comprises the series circuit of a resistor and a capacitor, which resistor is also in parallel with the anti-parallel-connected base-emitter junctions of two transistors, a diode being included in the emitter circuit of one of these transistors. The signals for controlling the switching device are taken from the collectors of these transistors.

When the power supply is switched on the capacitor is charged, causing the transistor whose emitter circuit includes the diode to be turned on. This transistor controls the switching device in such a way that the output of the circuit is disconnected. When the charging current of the capacitor decreases, this transistor is turned off gradually, so that the output is re-connected. After the power supply has been switched off the voltage across the capacitor appears across the base-emitter junction of the other transistor, so that this transistor is turned on and the output of the circuit is consequently disconnected.

A disadvantage of the circuit described above is that when the power supply is switched on the output of the circuit is first disconnected and then gradually re-connected. The disconnection is not effected immediately after switching on of the power supply, because the first-mentioned transistor cannot be turned on until a threshold voltage equal to two diode voltages is exceeded. Therefore, it is still possible that voltage transients appear on the output immediately after switching on of the power supply.

SUMMARY OF THE INVENTION

Therefore, the invention aims at effecting an improvement in this respect. According to the invention a circuit is characterized in that the control circuit comprises a current-mirror circuit having an input current path and an output current path. The input current is in series with a first resistor connected between the first and the second power-supply terminal. The output current path is in series with the capacitor between the first and the second power supply terminal, and the control circuit further comprises a first and a second transistor each having a base, an emitter and a collector electrode. The emitter electrodes are connected to the first power supply terminal by a common current element, the base electrodes of the first transistor and the second transistor are connected to the junction point of the first resistor and the input current path and to the junction point of the capacitor and the output current path of the current-mirror circuit, respectively. A control signal for controlling the switching device is taken from at least one of the collector electrodes of the first and the second transistor. With respect to the current-mirror circuit an embodiment of the invention may be characterized in that the input current path and the output current path comprise a third transistor and a fourth transistor respectively, each having a base, an emitter and a collector electrode. The bases of the third transistor and the fourth transistor are interconnected, the emitters of the third transistor and the fourth transistor being coupled to the first power-supply terminal, the collector of the third transistor being connected to its base and to the first resistor, and the collector of the fourth transistor being connected to the capacitor. In accordance with a further embodiment the charging current of the capacitor can be adjusted by choosing a suitable ratio between the resistance values of two resistors included in the emitter lines of the third transistor and the fourth transistor.

In a circuit in accordance with the invention the signal for disconnecting the output of the circuit need not be generated first, but it can become available almost immediately after switching on of the power supply, which practically precludes the occurrence of voltage transients on the output. The circuit has the advantage that it need comprise only a small number of components, so that it can be integrated on a small surface area. Moreover, it can operate at very low supply voltages as required in battery-powered equipment.

DESCRIPTION OF THE FIGURE

The invention will now be described in more detail, by way of example, with reference to the accompanying schematic drawing which shows an embodiment of the invention.

DESCRIPTION OF THE PREFERRED EMBODIMENT

The FIGURE shows schematically an electrical circuit 1 having an input 2 and an output 3. The circuit is, for example, a low-pass filter at the output of a Compact Disc player. The output 3 can be disconnected from the circuit 1 by means of a switching device 4. Such switching devices are described in inter alia U.S. Pat. Nos. 4,371,841 and 4,315,221 and European Patent Application No. 8,403,819 corresponding to U.S. patent application Ser. No. 799,877 filed simultaneously with the present Application. The switching device is controlled by a control device 5. This control device comprises a current mirror comprising an input current path including a diode-connected PNP transistor $T_1$ whose emitter is connected to the positive power-supply terminal 10 by means of a resistor $R_1$, and an output current path including a PNP transistor $T_2$ whose base is connected to the base of transistor $T_1$ and whose emitter is connected to the positive power-supply terminal 10 by means of a resistor $R_2$. The input current path and the output current path are connected to the negative power-supply terminal 20, in the present case earth, by a resistor $R_3$ and a capacitor $C_1$, respectively. The circuit further comprises two PNP transistors $T_3$ and $T_4$, which are connected as a differential pair and whose common emitters are coupled to the positive power supply terminal by a resistor $R_4$. The base of transistor $T_3$ is connected to the junction point 12 of resistor $R_3$ and transistor $T_1$ and the base of transistor $T_4$ is connected to the junction point 14 of capacitor $C_1$ and transistor $T_2$. The collectors of transistors $T_3$, $T_4$ constitute the outputs of the control circuit 5 for controlling the switching device 4.

The circuit operates as follows. Initially, the capacitor $C_1$ carries no charge, so that the voltage on the base 14 of transistor $T_4$ is 0 V. When the power supply is switched on a current will flow via the low-impedance input path $T_1$, $R_1$ of the current mirror and the resistor $R_3$, so that the voltage on the base 12 of the transistor $T_3$ is high relative to the voltage on the base 14 of the transistor $T_4$. The entire tail current in the resistor $R_4$ therefore flows through the transistor $T_4$ and transistor $T_3$ is completely currentless. If the switching device 4 is, for example, of the type described in the simultaneously filed European Patent Application No. 8,403,819, corresponding to U.S. patent application Ser. No. 799,877 in which the output is disconnected if no signal appears on the collector of the transistor $T_3$ and a signal appears on the collector of the transistor $T_4$. The output 3 will be disconnected from the remainder of the circuit 1 immediately after switching on the power supply.

The current mirror circuit produces a current in the output current path $T_2$, $R_2$, whose ratio to the current in the input current path is equal to the ratio between the values of the resistors $R_1$ and $R_2$. This current charges the capacitor $C_1$, so that the voltage on the base 14 of the transistor $T_4$ increases. As a result of this, the transistor $T_4$ is gradually turned off and the transistor $T_3$ is gradually turned on. The switching device 4 is then driven in such a way that the signal path to the output 3 is gradually connected. The output 3 is connected fully to the circuit 1 at the instant at which transistor $T_4$ is cut off and the full tail current flows through the transistor $T_3$.

The capacitor $C_1$ is charged so far that the transistor $T_2$ is fully saturated, causing the collector-base junction of this transistor to conduct. When the power supply is switched off the voltage on the positive power supply terminal 10 and hence on the commoned emitters of the transistors $T_3$ and $T_4$ falls to 0 V. The voltage on the base 14 of the transistor $T_4$ and, as a result of the conducting collector-base junction of the transistor $T_2$, also the voltage on the base 12 of the transistor $T_1$ remain high initially. This ensures that the transistors $T_3$ and $T_4$ are cut off immediately after switching off the supply voltage. Thus, the output 3 is disconnected immediately from the circuit 4. Subsequently, the capacitor $C_1$ is discharged further via the resistor $R_3$.

The present embodiment is particularly suitable for use at low supply voltages because the circuit becomes operative at a supply voltage higher than one base-emitter voltage. Moreover, since the circuit comprises a very small number of components, it can be integrated on a very small surface. The capacitor $C_1$ is then the only component which need be external to the integrated circuit. It is obvious that the PNP transistors in the present embodiment may be replaced by NPN transistors, in which case the polarity of the supply voltage must be reversed. In the present embodiment the control circuit employs an asymmetrical power supply with the negative supply line being earthed. However, it is also possible to employ a symmetrical power supply for the control circuit.

The invention is not limited to the embodiments described in the foregoing. For example, at least one of the two emitter resistors $R_1$ and $R_2$ of the transistors $T_1$ and $T_2$ may be dispensed with. Furthermore, instead of the present current mirror circuit comprising two transistors it is possible to use current mirror circuits which are known per se and which comprise more than two transistors.

In the present embodiment the switching device is controlled by both collector currents. However, depending on the type of switching device, it is also possible to use only one of the collector currents. If the switching device is of the kind described in U.S. Pat. No. 4,315,221 only the collector of the transistor $T_3$ must be connected to the switching device 4 and the collector of the transistor $T_4$ may be connected to the negative power supply terminal 20.

Thus, there is described one embodiment and several modifications of the invention described more particularly by the claims which follow.

What is claimed is:

1. A circuit for reducing the occurrence of spurious signals on an electronic circuit during energization and de-energization of a power supply comprising:

a switching device for opening and closing a path from said electronic circuit;

a control circuit for operating said switching device including:

a capacitor connected to one terminal of said power supply;

a current mirror circuit having an input current path and an output current path, said output current path being serially connected with said capacitor and a remaining terminal of said power supply for charging said capacitor, said input current path connected in series with a first resistor and said power supply terminals; and first and second differentially connected transistors having common emitter connections connected through a common current element to said remaining power supply terminal, a base of said second transistor being connected to a junction formed by said capacitor and output current path, a base of said first transistor being connected to a junction formed by said first resistor, said input current path and an input of said current mirror circuit, at least one of said transistors having a collector connected to operate said switching device.

2. A circuit as claimed in claim 1, wherein the input current path and the output current path comprise a third transistor and a fourth transistor respectively, each having a base, an emitter and a collector electrode, the bases of the third transistor and the fourth transistor being interconnected, the emitters of the third transistor and the fourth transistor being coupled to the remaining power-supply terminal, the collector of the third transistor being connected to its base and to the first resistor, and the collector of the fourth transistor being connected to the capacitor.

3. A circuit as claimed in claim 2, characterized in that the emitter electrodes of the third transistor and the fourth transistor are coupled to the remaining power supply terminal by a second resistor and a third resistor, respectively.

4. A circuit for reducing the occurrence of spurious signals of an electronic circuit during energization and de-energization of a power supply comprising:
- a switching device for opening and closing a path from said electronic circuit in response to a control current;
- first and second transistors each having a base, an emitter, and a collector, said emitters being connected together and to a first terminal of said power supply, at least one of said collectors being connected to supply a control current to said switching device;
- third and fourth transistors each having a base, emitter and collector, said third and fourth transistors being connected as a current mirror having common bases and having said emitters connected to carry separate currents to said power supply first terminal;
- a capacitor having one end connected to said fourth transistor collector and to said second transistor base, and a remaining end connected to a second terminal of said power supply;
- an electrical resistance having one end connected to said common bases, said first transistor base, and said third transistor collector, and a remaining end connected to said power supply second terminal;
- whereby during energization of said power supply, said second transistor is initially switched into a conducting state until said capacitor is charged, switching said first transistor into a conducting state, and during a de-energization of said power supply, said first and second transistors are maintained in a non-conducting state by a voltage on said capacitor, whereby said at least one collector of said first and second transistors maintains said switching device open during energization and de-energization of said power supply.

* * * * *